United States Patent
Asaoka et al.

(10) Patent No.: US 10,611,152 B2
(45) Date of Patent: Apr. 7, 2020

(54) LIQUID EJECTING HEAD, LIQUID EJECTING APPARATUS, AND PIEZOELECTRIC DEVICE

(71) Applicant: SEIKO EPSON CORPORATION, Tokyo (JP)

(72) Inventors: Ichiro Asaoka, Suwa (JP); Eiju Hirai, Azumino (JP); Tsutomu Nishiwaki, Azumino (JP); Hiroshi Kato, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/133,394

(22) Filed: Sep. 17, 2018

(65) Prior Publication Data
US 2019/0092016 A1 Mar. 28, 2019

(30) Foreign Application Priority Data

Sep. 19, 2017 (JP) .................. 2017-178646
Jan. 30, 2018 (JP) .................. 2018-013692

(51) Int. Cl.
*B41J 2/14* (2006.01)
*H01L 41/047* (2006.01)

(52) U.S. Cl.
CPC ....... *B41J 2/14233* (2013.01); *B41J 2/14274* (2013.01); *H01L 41/0471* (2013.01)

(58) Field of Classification Search
CPC .............. B41J 2/14233; B41J 2/14274; H01L 41/0471
See application file for complete search history.

(56) References Cited

U.S. PATENT DOCUMENTS

| | | |
|---|---|---|
| 2009/0079800 A1 | 3/2009 | Li et al. |
| 2011/0193916 A1 | 8/2011 | Hirai et al. |
| 2011/0234708 A1 | 9/2011 | Nakayama et al. |

(Continued)

FOREIGN PATENT DOCUMENTS

| | | |
|---|---|---|
| JP | 2009160841 A | 7/2009 |
| JP | 2014-179549 A | 9/2014 |

(Continued)

OTHER PUBLICATIONS

IP.com search (Year: 2019).*
European Search Report issued in Application No. 18195493 dated Jan. 8, 2019.

*Primary Examiner* — Lisa Solomon
(74) *Attorney, Agent, or Firm* — Workman Nydegger (57) ABSTRACT

Provided is a liquid ejecting head including a pressure chamber to accommodate a liquid, a vibration plate, a nozzle to eject the liquid, and a piezoelectric element. The piezoelectric element includes a piezoelectric body layer, a first electrode disposed on one surface of the piezoelectric body layer, and a second electrode disposed on the other surface of the piezoelectric body layer. The liquid ejecting head further includes wiring connected to the second electrode and extended along a surface direction of the piezoelectric body layer, and does not include a metal layer having the same potential as the first electrode in a first area which is an area positioned between the wiring and the vibration plate and in which the wiring overlaps with none of the second electrode and the piezoelectric body layer in a direction perpendicular to a surface direction of the second electrode.

8 Claims, 8 Drawing Sheets

(56) References Cited

U.S. PATENT DOCUMENTS

| | | |
|---|---|---|
| 2013/0201258 A1 | 8/2013 | Hirai |
| 2016/0082735 A1 | 3/2016 | Furuya et al. |
| 2016/0185117 A1 | 6/2016 | Tanaka et al. |
| 2017/0173955 A1 | 6/2017 | Mizukami |
| 2017/0173958 A1 | 6/2017 | Tanaka et al. |

FOREIGN PATENT DOCUMENTS

| | | |
|---|---|---|
| JP | 2016-124118 A | 7/2016 |
| JP | 2017-112281 A | 6/2017 |

* cited by examiner

LIQUID EJECTING HEAD, LIQUID EJECTING APPARATUS, AND PIEZOELECTRIC DEVICE

CROSS-REFERENCE TO RELATED APPLICATION

The entire disclosure of Japanese Patent Application No. 2017-178646, filed Sep. 19, 2017 and Japanese Patent Application No. 2018-013692, filed Jan. 30, 2018 are expressly incorporated by reference herein.

BACKGROUND

1. Technical Field

The present invention relates to a liquid ejecting head, a liquid ejecting apparatus, and a piezoelectric device.

2. Related Art

A liquid ejecting head equipped with a piezoelectric element for ejecting a liquid is widely used in a liquid ejecting apparatus. The piezoelectric element is mainly provided with a piezoelectric body, a lower electrode formed on one surface of the piezoelectric body, and an upper electrode formed on the other surface of the piezoelectric body at a position opposing the lower electrode with the piezoelectric body interposed therebetween. For example, the lower electrode is formed as a common electrode that is conducted across a plurality of piezoelectric elements, while the upper electrode is formed as an individual electrode. In addition, wiring to function as an individual electrode is connected to the upper electrode. A protection film having an insulation function is formed between the wiring connected to the upper electrode and the lower electrode (for example, see JP-A-2014-179549).

A flaw is generated in some cases due to some cause in the protection film formed between the lower electrode and the wiring connected to the upper electrode. In this case, when a voltage is applied to the upper electrode, a current flows from the wiring into the lower electrode through the above-mentioned flaw, thereby raising a problem that the piezoelectric element cannot be normally driven.

SUMMARY

The invention is contrived to solve at least part of the above problem, and can be implemented as the following aspects or application examples.

1. According to an aspect of the present disclosure, provided is a liquid ejecting head including a pressure chamber to accommodate a liquid, a vibration plate constituting a wall surface of the pressure chamber, a nozzle to eject the liquid accommodated in the pressure chamber, and a piezoelectric element disposed on one side of the vibration plate. The piezoelectric element includes a piezoelectric body layer configured to deform when a voltage is applied thereto, a first electrode positioned between the vibration plate and the piezoelectric body layer and disposed on one surface of the piezoelectric body layer, and a second electrode disposed on the other surface of the piezoelectric body layer. The liquid ejecting head further includes wiring connected to the second electrode and extended along a surface direction of the piezoelectric body layer, and does not include a metal layer having the same potential as the first electrode in a first area which is an area positioned between the wiring and the vibration plate and in which the wiring overlaps with none of the second electrode and the piezoelectric body layer in a direction perpendicular to a surface direction of the second electrode.

In the above aspect, a trouble that the wiring and a metal having the same potential as the first electrode are short-circuited is prevented when a voltage is applied to the second electrode through the wiring, thereby making it possible to stably drive the piezoelectric element.

2. The liquid ejecting head according to the above aspect can also be configured not to include a metal layer in the above-mentioned first area.

In this aspect, since a metal layer is not disposed, regardless of its potential, in the first area which is an area between the vibration plate and the wiring connected to the second electrode, a trouble of the wiring being short-circuited can be prevented and consequently the piezoelectric element can be stably driven.

3. The liquid ejecting head according to the above-mentioned aspect can also be configured to include, in the first area, a metal layer that is made of the same material as that of the first electrode and is not electrically connected to the first electrode.

In such an aspect, the metal layer provided in the first area, which is an area positioned between the vibration plate and the wiring connected to the second electrode, is not electrically connected to the first electrode. This makes it possible to prevent the trouble of the wiring being short-circuited, and to stably drive the piezoelectric element.

4. According to another aspect of the disclosure, provided is a liquid ejecting apparatus including the liquid ejecting head according to the above-discussed aspect.

5. According to another aspect of the disclosure, provided is a piezoelectric device including a vibration plate, and a piezoelectric element disposed on one side of the vibration plate. The stated piezoelectric element includes a piezoelectric body layer configured to deform when a voltage is applied thereto, a first electrode positioned between the vibration plate and the piezoelectric body layer and disposed on one surface of the piezoelectric body layer, and a second electrode disposed on the other surface of the piezoelectric body layer. The piezoelectric device further includes wiring connected to the second electrode and extended along a surface direction of the piezoelectric body layer, and does not include a metal layer having the same potential as the first electrode in a first area which is an area positioned between the wiring and the vibration plate and in which the wiring overlaps with none of the second electrode and the piezoelectric body layer in a direction perpendicular to a surface direction of the second electrode.

6. According to another aspect of the disclosure, provided is a liquid ejecting head including a pressure chamber to accommodate a liquid, a vibration plate constituting a wall surface of the pressure chamber, a nozzle to eject the liquid accommodated in the pressure chamber, and a piezoelectric element disposed on an opposite side of the vibration plate to the pressure chamber. The piezoelectric element of the stated liquid ejecting head includes a piezoelectric body layer configured to deform when a voltage is applied thereto, a first electrode positioned between the vibration plate and the piezoelectric body layer and disposed on one surface of the piezoelectric body layer, and a second electrode disposed on the other surface of the piezoelectric body layer. The liquid ejecting head further includes wiring connected to the second electrode and extended along a surface direction of the piezoelectric body layer. A second area which is an area positioned between the second electrode and the vibration plate and is also positioned between the vibration plate and an end portion of the second electrode on a side of a direction in which the wiring is extended, is constituted of an insulation portion including the piezoelectric body layer. With the liquid ejecting head of this aspect, a trouble that the wiring and the first electrode are short-circuited can be prevented when a voltage is applied to the second electrode through the wiring, thereby making it possible to stably drive the piezoelectric element.

Not all of the plurality of constituent elements included in the above-mentioned aspects of the invention are absolutely necessary; that is, in order to solve part of or all of the above-mentioned problems, or in order to obtain part of or all of the effects described in the present specification, part of the plurality of constituent elements can be modified, deleted or replaced with other new constituent elements, and limited contents thereof can be partially deleted. Moreover, in order to solve part of or all of the above problems, or in order to obtain part of or all of the effects described in the present specification, it is also possible to contrive an independent aspect of the invention by combining part of or all of the technical features included in the aspect of the invention and part of or all of the technical features included in the another aspect of the invention.

The invention can also be implemented in various aspects other than a liquid ejecting head, a liquid ejecting apparatus, and a piezoelectric device. For example, the invention can be implemented in the aspects such as a manufacturing method, a control method, or the like of the above-discussed device or apparatus, a computer program to enable the stated control method, and a permanent recording medium in which the above computer program is recorded.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
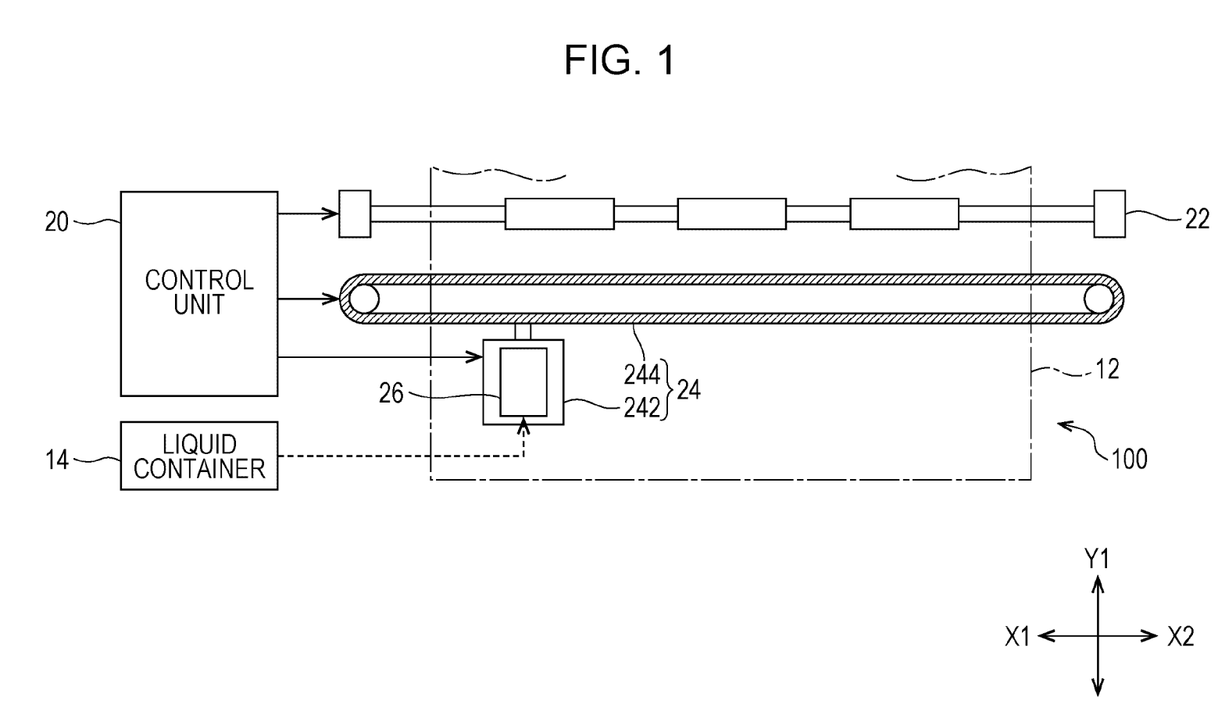
FIG. 1 is a descriptive diagram illustrating a liquid ejecting apparatus in which a liquid ejecting head is mounted according to a first embodiment.

FIG. 1 is a descriptive diagram illustrating a liquid ejecting apparatus 100 in which a liquid ejecting head is mounted according to a first embodiment. Note that in FIG. 1, an arrow indicating one direction in an X direction as an "X1 direction", an arrow indicating a direction opposite to the X1 direction as an "X2 direction", an arrow indicating one direction in a Y direction orthogonal to the X direction as a "Y1 direction", and an arrow indicating a direction opposite to the Y1 direction as a "Y2 direction" are described. A plane configured with the X direction and the Y direction is referred to as an "XY plane". Although not illustrated in FIG. 1, one direction in a Z direction orthogonal to the XY plane is taken as a "Z1 direction", and a direction opposite thereto is taken as a "Z2 direction". Further, a plane configured with the X direction and the Z direction is taken as an "XZ plane", and a plane configured with the Y direction and the Z direction is taken as a "YZ plane". The above-described arrows are also described in the subsequent drawings.

The liquid ejecting apparatus 100 includes a control unit 20, a transport mechanism 22, a movement mechanism 24, and a liquid ejecting head 26. In addition, a liquid container 14 to accommodate ink is attached to the liquid ejecting apparatus 100, and a medium 12 can be set in the apparatus. The liquid ejecting apparatus 100 is an ink jet-type printing apparatus configured to eject ink, which is a liquid supplied from the liquid container 14, onto the medium 12.

The control unit 20 is configured by a computer equipped with, for example, a CPU, a ROM, a RAM and the like. The control unit 20 controls the transport mechanism 22, the movement mechanism 24, and the liquid ejecting head 26.

The movement mechanism 24 includes an annular belt 244 and a carriage 242. The carriage 242 is fixed to the belt 244 and accommodates the liquid ejecting head 26. The movement mechanism 24 reciprocates the liquid ejecting head 26 accommodated in the carriage 242 along the X direction by revolving the annular belt 244 bidirectionally.

The liquid ejecting head 26 is provided with a plurality of nozzles Nz for ejecting a liquid. The structure of the nozzle Nz will be explained later. The liquid ejecting head 26 is controlled by the control unit 20 and ejects ink supplied from the liquid container 14 onto the medium 12 through the plurality of nozzles Nz.

The transport mechanism 22 transports the medium 12 along the Y direction while the liquid ejecting head 26 being moved back and forth a plurality of times in the X direction by the movement mechanism 24. An image is formed on the medium 12 by the ink ejected toward a virtual plane expanded in the X direction and the Y direction.

The control unit 20 controls the movement of the medium 12 in the Y direction under the control of the transport mechanism 22, the movement of the carriage 242 in the X direction under the control of the belt 244, and the ejection of ink from the liquid ejecting head 26, thereby forming a predetermined image on the medium 12.

Figure 2:
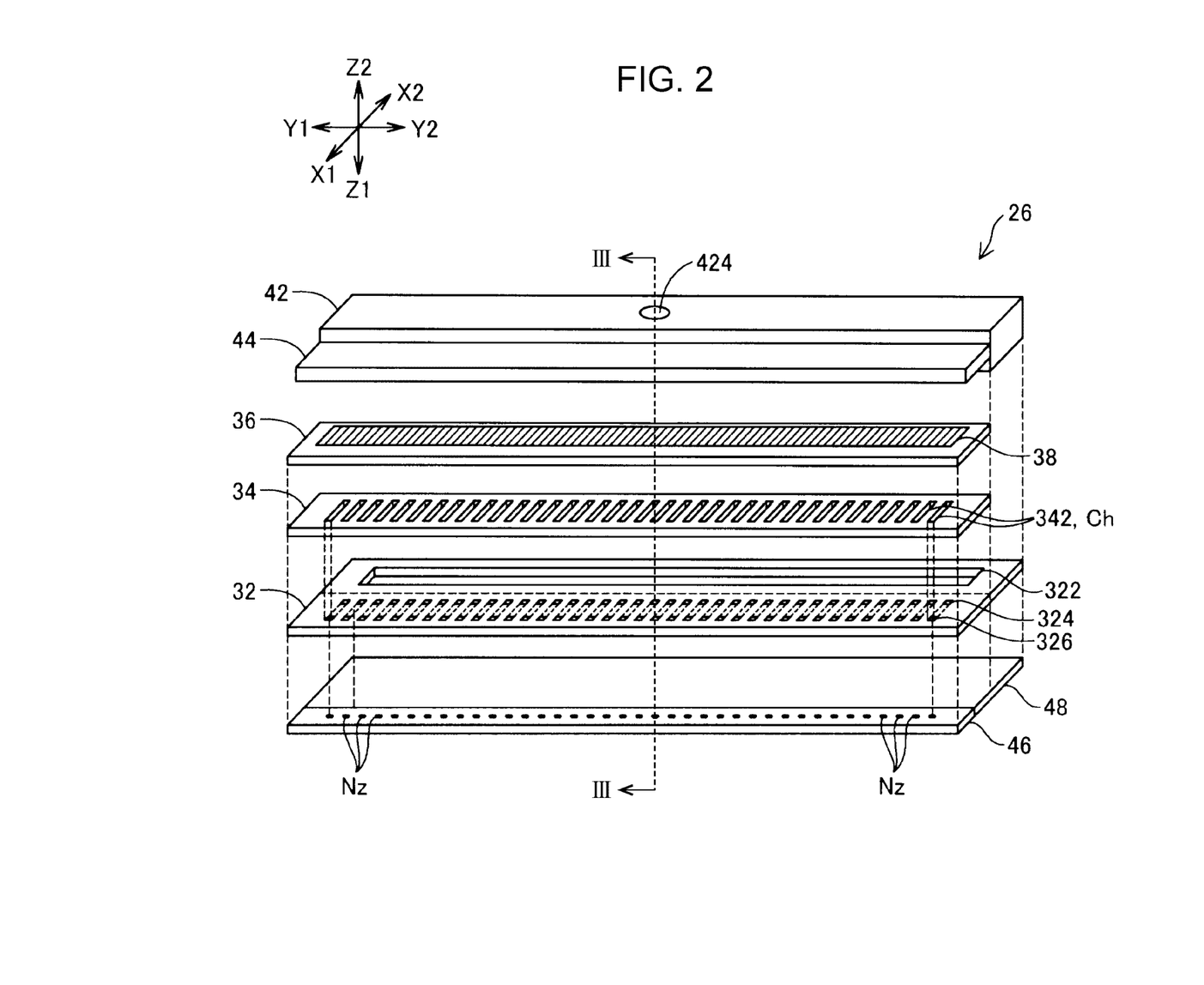
FIG. 2 is an exploded perspective view of a liquid ejecting head.

FIG. 2 is an exploded perspective view of the liquid ejecting head 26. The liquid ejecting head 26 includes a channel substrate 32, a pressure chamber substrate 34, a vibration plate 36, a housing unit 42, a sealing unit 44, a nozzle plate 46, and a vibration absorbing unit 48.

Figure 3:
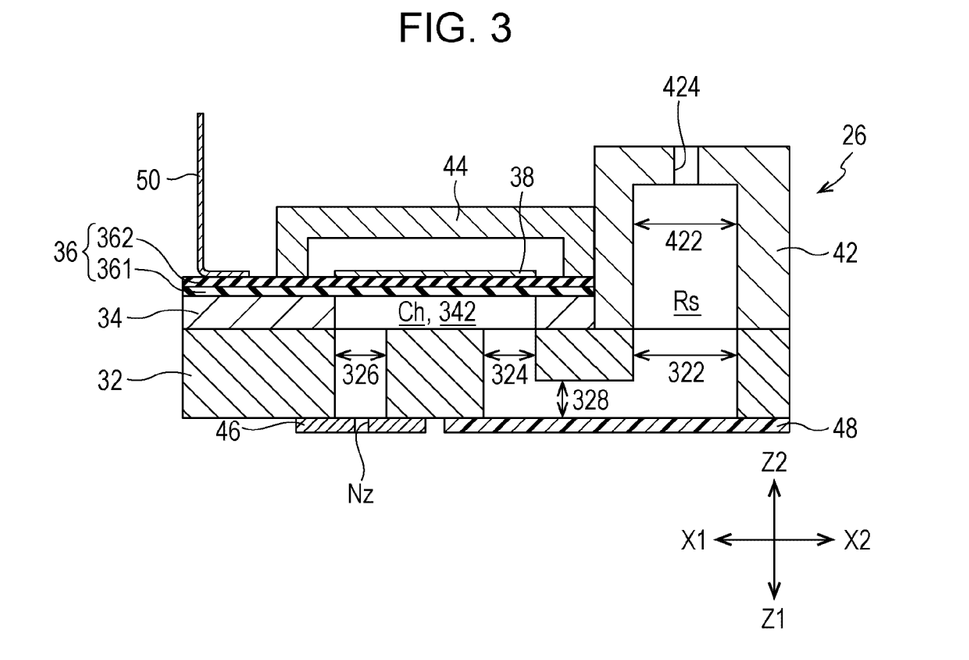
FIG. 3 is a cross-sectional view of the liquid ejecting head.

FIG. 3 is a cross-sectional view of the liquid ejecting head 26 in a state where members constituting the liquid ejecting head 26 are bonded to each other. To be specific, FIG. 3 is a cross-sectional view parallel to an XZ plane taken along a III-III line of the liquid ejecting head 26 in FIG. 2. The structure of the liquid ejecting head 26 will be described below with reference to FIG. 2 as well as FIG. 3.

The nozzle plate 46 is a plate-like member formed in a substantially rectangular shape elongated in the Y direction. The nozzle plate 46 is disposed on a surface on a Z1 side of the channel substrate 32. Specifically, the nozzle plate 46 is disposed in such a manner as to cover part of an area of the channel substrate 32 where a communication channel 326 to be explained later is provided. The plurality of nozzles Nz is formed being aligned in the Y direction in the nozzle plate 46. The nozzle Nz is a through-hole through which ink is ejected.

The channel substrate 32 is a plate-like member formed in a substantially rectangular shape elongated in the Y direction. The channel substrate 32 includes an opening section 322, a supply channel 324, the communication channel 326, and a relay channel 328. Note that the relay channel 328 is not illustrated in FIG. 2 because it is provided in the surface on the Z1 side of the channel substrate 32.

The opening section 322 is a through-hole extending in the Z direction in the channel substrate 32. The opening section 322 is an opening formed in a shape elongated in the Y direction.

The communication channel 326 is a through-hole extending in the Z direction in the channel substrate 32. A plurality of communication channels 326 is aligned along the Y direction in the surface of the channel substrate 32. The number of communication channels 326 and the number of nozzles Nz are the same. The size of an outer shape on the Z1 side of the communication channel 326 is greater than the size of an outer shape on the Z2 side of the nozzle Nz. The nozzle Nz and the communication channel 326 are connected by the channel substrate 32 and the nozzle plate 46 being bonded to each other (see FIG. 3). Ink to be ejected through the nozzles Nz passes through in the corresponding communication channels 326.

Supply channels 324 are a plurality of through-holes extending in the Z direction in the channel substrate 32. The plurality of supply channels 324 is aligned along the Y direction in the surface of the channel substrate 32. Each of the supply channels 324 is provided between the common opening section 322 and the communication channel 326 to which each of the supply channels 324 is connected. One supply channel 324 is connected to one nozzle Nz via a pressure chamber Ch to be explained later and the above-mentioned communication channel 326. The number of supply channels 324 and the number of nozzles Nz are the same. Ink to be ejected through the nozzles Nz passes through in the corresponding supply channels 324 (see FIG. 3).

The relay channel 328 is a recessed portion provided in the surface on the Z1 side of the channel substrate 32 (not illustrated in FIG. 2). The relay channel 328 connects the opening section 322 and the plurality of supply channels 324 in the surface on the Z1 side of the channel substrate 32. Ink to be ejected through the nozzles Nz included in the liquid ejecting head 26 passes through the relay channel 328 (see FIG. 3).

The pressure chamber substrate 34 is a plate-like member formed in a substantially rectangular shape elongated in the Y direction. The pressure chamber substrate 34 is disposed on the surface on the Z2 side of the channel substrate 32. Specifically, the pressure chamber substrate 34 is disposed in such a manner as to cover part of an area of the channel substrate 32 where the supply channel 324 and the communication channel 326 are provided. A plurality of opening sections 342 are provided in the pressure chamber substrate 34.

The opening sections 342 are a plurality of through-holes extending in the Z direction in the pressure chamber substrate 34. The opening section 342 is an opening formed in a shape elongated in the X direction. The plurality of opening sections 342 is aligned along the Y direction on the surface of the channel substrate 32. The number of opening sections 342 and the number of nozzles Nz are the same. The opening section 342 is disposed at a position where the stated opening section 342, when projected in the Z direction, overlaps with a pair of the supply channel 324 and the communication channel 326 arranged side by side in the X direction in the channel substrate 32. The opening section 342 functions as the pressure chamber Ch configured to accommodate ink and apply pressure to the ink in the channel inside the liquid ejecting head 26 (see FIG. 3).

The vibration absorbing unit 48 is a plate-like member formed in a substantially rectangular shape elongated in the Y direction. The vibration absorbing unit 48 is disposed on the surface on the Z1 side of the channel substrate 32. Specifically, the vibration absorbing unit 48 is disposed in such a manner as to cover part of an area of the channel substrate 32 where the opening section 322, the relay channel 328, and the supply channel 324 are provided. The vibration absorbing unit 48 functions as an inner wall to seal the Z1 side of the opening section 322, the relay channel 328, and the supply channel 324 (see FIG. 3). In addition, the vibration absorbing unit 48 is constituted with a sheet-like member capable of elastic deformation by having flexibility. The vibration absorbing unit 48 is so constituted as to alleviate a change in pressure by elastically deforming the ink in the opening section 322, the relay channel 328, and the supply channel 324 in accordance with the pressure.

The vibration plate 36 is a plate-like member formed in a shape with an outer shape matching the outer shape of the pressure chamber substrate 34. The vibration plate 36 is disposed on a surface on the Z2 side of the pressure chamber substrate 34. The vibration plate 36 functions as a wall surface to seal the opening on the Z2 side of the opening section 342 in the pressure chamber substrate 34 (see FIG. 3). The vibration plate 36 can be elastically deformed by a piezoelectric actuator 38.

The vibration plate 36 includes a first film 361 and a second film 362 (see FIG. 3). The first film 361 is disposed on the surface on the Z2 side of the pressure chamber substrate 34. The second film 362 is disposed on a surface of the first film 361 on the opposite side to the side where the pressure chamber substrate 34 is disposed with the first film 361 interposed therebetween. The first film 361 is an elastic film formed with an elastic material such as silicon oxide ($SiO_2$). The second film 362 is an insulation film formed with an insulation material such as zirconium oxide ($ZrO_2$).

The piezoelectric actuators 38 are aligned along the Y direction on a surface on the Z2 side of the vibration plate 36. One piezoelectric actuator 38 is disposed at a position where the stated piezoelectric actuator 38 overlaps with one opening section 342 of the pressure chamber substrate 34 with the vibration plate 36 interposed therebetween. The piezoelectric actuator 38 is bonded to the vibration plate 36 with a close contact layer (not illustrated) interposed therebetween. The number of piezoelectric actuators 38 and the number of nozzles Nz are the same.

A wiring substrate 50 is a mounted component being connected to the surface on the Z2 side of the vibration plate 36 (see FIG. 3). A plurality of pieces of wiring is formed on the wiring substrate 50 to electrically connect the liquid ejecting head 26 and the control unit 20 (see FIG. 1) as well as a power supply circuit (not illustrated in FIGS. 1 to 3). The wiring substrate 50 supplies a drive signal for driving the piezoelectric actuator 38 to each of the piezoelectric actuators 38. The wiring substrate 50 may employ, for example, a flexible substrate such as an FPC (Flexible Printed Circuit) or an FFC (Flexible Flat Cable). Note that in order to facilitate the understanding of the technique, the wiring substrate 50 is omitted in FIG. 2.

The sealing unit 44 is disposed on the Z2 side relative to the vibration plate 36 and the piezoelectric actuator 38. To be specific, the sealing unit 44 is bonded in such a manner as to cover part of an area of the vibration plate 36 where the piezoelectric actuator 38 is provided. The sealing unit 44 is a plate-like member formed in a substantially rectangular shape elongated in the Y direction. A surface on the Z1 side of the sealing unit 44 is opened, thereby causing the sealing unit 44 to include a single recess portion. The sealing unit 44 and the vibration plate 36 are bonded to each other in such a manner that the piezoelectric actuator 38 is accommodated inside the above-mentioned recess portion (see FIG. 3). The sealing unit 44 protects the piezoelectric actuator 38 and performs a function to reinforce the mechanical strength with the pressure chamber substrate 34 and the vibration plate 36.

The housing unit 42 is disposed on the Z2 side relative to the channel substrate 32. To be specific, the housing unit 42 is bonded in such a manner as to cover part of an area of the channel substrate 32 where the opening section 322 is provided. The housing unit 42 is a member formed in a substantially rectangular shape elongated in the Y direction. A surface on the Z1 side of the housing unit 42 is opened, thereby causing the housing unit 42 to include a single recess portion. The housing unit 42 includes an accommodation section 422 and an inlet 424.

The accommodation section 422 is a space inside the housing unit 42 formed by the recess portion of the housing 42 (see FIG. 3). An outer shape of the opening on the Z1 side of the accommodation section 422 is substantially the same as an outer shape of the opening on the Z2 side of the opening section 322 provided in the channel substrate 32. The housing unit 42 is bonded to part of the surface in the Z2 direction of the channel substrate 32. At this time, the housing unit 42 and the channel substrate 32 are bonded to each other in such a manner that the outer shape of the accommodation section 422 matches the outer shape of the opening section 322 (see FIG. 3). A single space is formed by the opening section 322 provided in the channel substrate 32 and the accommodation section 422 provided in the housing unit 42. This space is also called a liquid reservoir chamber Rs. Note that the accommodation section 422 is not illustrated in FIG. 2 because it is provided in the surface on the Z1 side of the housing unit 42.

The inlet 424 is a through-hole extending in the Z direction in the housing unit 42, and is connected to the accommodation section 422 (see FIG. 3). The inlet 424 is provided substantially in the center of the surface on the Z2 side of the housing unit 42. Ink supplied to the liquid ejecting head 26 from the liquid container 14 passes through the inlet 424, and is stored in the liquid reservoir chamber Rs.

The ink stored in the liquid reservoir chamber Rs passes through the relay channel 328, branches to the respective supply channels 324, and is then supplied in parallel to the respective pressure chambers Ch (opening sections 342). Each of the piezoelectric actuators 38 deforms when a voltage is applied thereto via the wiring substrate 50, so as to deform the vibration plate 36 constituting an inner wall of each of the opening sections 342 (in other words, the pressure chambers Ch). As a result, the pressure chamber Ch is deformed and pressure is applied to the ink inside the pressure chamber Ch. Due to this pressure, the ink filling the pressure chamber Ch is pushed out, passes through the communication channel 326, and then is ejected through the nozzle Nz (see FIG. 3).

Figure 4:
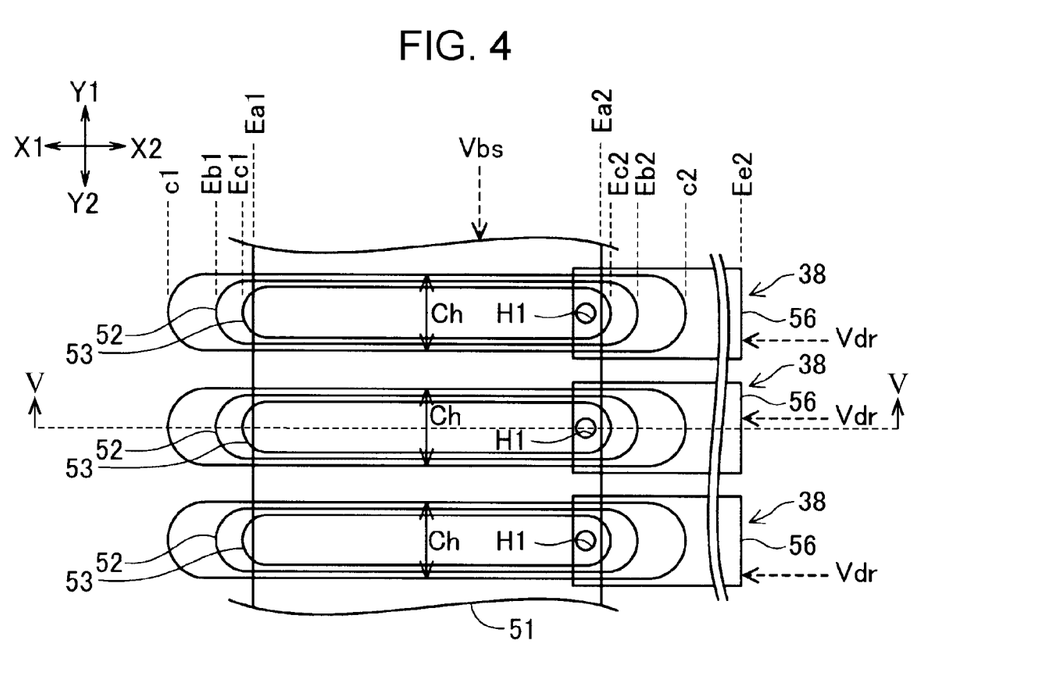
FIG. 4 is a plan view illustrating arrangement of a pressure chamber, a piezoelectric actuator 38, and wiring when a liquid ejecting head is seen through in a Z direction.

FIG. 4 is a plan view illustrating the arrangement of the pressure chamber Ch, the piezoelectric actuator 38, and wiring 56 when the liquid ejecting head 26 is seen through in the Z direction. Members that are positioned on a rear (Z1 direction) side of FIG. 4 and cannot be visually recognized due to members positioned on a front (Z2 direction) side of the drawing are also illustrated in FIG. 4. In FIG. 4, illustrated is a peripheral constitution of a plurality of piezoelectric actuators 38 (three actuators in FIG. 4) provided on the vibration plates 36.

Figure 5:
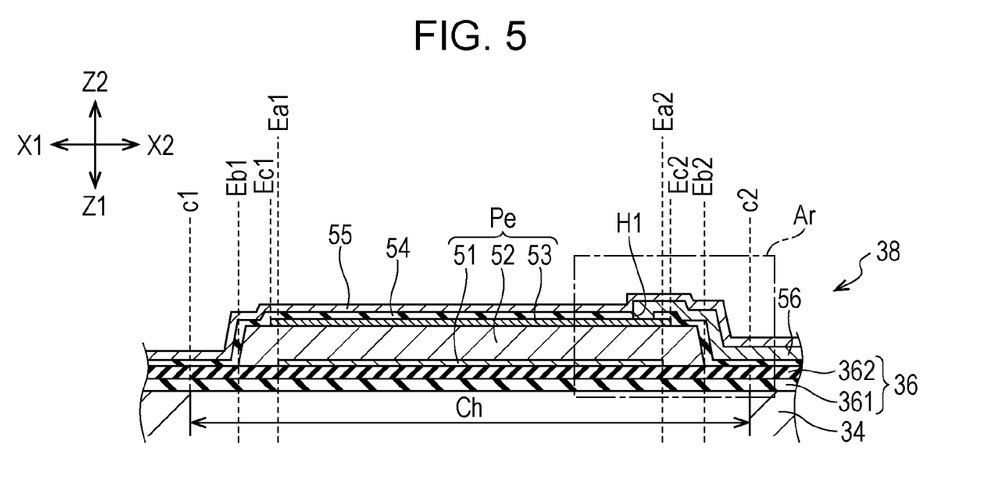
FIG. 5 is a cross-sectional view of the piezoelectric actuator 38 taken along a V-V line in FIG. 4.

FIG. 5 is a cross-sectional view taken along a V-V line in FIG. 4. Specifically, FIG. 5 is a cross-sectional view on an XZ plane including a substantially center portion in a short-length direction of the piezoelectric actuator 38. The structure of the piezoelectric actuator 38 will be described below with reference to FIGS. 4 and 5.

The piezoelectric actuator 38 includes a piezoelectric element Pe, a first protection film 54, a second protection film 55, and the wiring 56 (see FIG. 5). The piezoelectric element Pe includes a first electrode 51, a piezoelectric body layer 52, and a second electrode 53. Meanwhile, in order to facilitate the understanding of the technique, the first protection film 54 and the second protection film 55 are not illustrated in FIG. 4.

The first electrode 51 is a conductive layer having a substantially uniform thickness. The first electrode 51 is disposed on a surface on the Z2 side of the second film 362 of the vibration plate 36 (see FIG. 5). The first electrode 51 is a so-called common electrode shared by a plurality of piezoelectric elements Pe aligned in the Y direction. An end portion Ea1 in the X1 direction of the first electrode 51 is so formed as to be positioned on the X2 side relative to an end portion Ec1 in the X1 direction of the second electrode 53. Further, an end portion Ea2 in the X2 direction of the first electrode 51 is so formed as to be positioned on the X1 side relative to an end portion Ec2 in the X2 direction of the second electrode 53. A reference voltage Vbs is supplied to the first electrode 51 from a circuit provided on the wiring substrate 50. Meanwhile, in the present specification, since a function to deform based on the deformation of the piezoelectric body layer 52 is individually performed by each piezoelectric actuator 38, the liquid ejecting head 26 is described as including a "plurality of piezoelectric actuators 38".

The piezoelectric body layer 52 is a layer having a substantially uniform thickness that is formed on a surface on the Z2 side of the first electrode 51 and a surface on the Z2 side without the first electrode 51 of the vibration plate 36. The piezoelectric body layer 52 is formed to cover an outer shape of the first electrode 51 (see FIG. 5). The piezoelectric body layer 52 is formed as follows, for example: a film of a piezoelectric material such as lead zirconate titanate (PZT) is formed by sputtering and is selectively removed by photolithography. An end portion Eb1 in the X1 direction of the piezoelectric body layer 52 is formed to be positioned on the X2 side relative to an end portion c1 in the X1 direction of the pressure chamber Ch. An end portion Eb2 in the X2 direction of the piezoelectric body layer 52 is formed to be positioned on the X1 side relative to an end portion c2 in the X2 direction of the pressure chamber Ch. An end portion in the Y1 direction of the piezoelectric body layer 52 is formed to be positioned on the Y2 side relative to an end portion in the Y1 direction of the pressure chamber Ch. An end portion in the Y2 direction of the piezoelectric body layer 52 is formed to be positioned on the Y1 side relative to the end portion c2 in the Y2 direction of the pressure chamber Ch. In other words, the piezoelectric body layer 52 is formed in such a manner that an outer shape in an XY plane view of the piezoelectric body layer 52 is set inside an outer shape of an upper end in the Z2 direction of the pressure chamber Ch in an XY plane view. The piezoelectric body layer 52 deforms in the Z1 direction when a voltage is applied thereto from the first electrode 51 and the second electrode 53.

The second electrode 53 is a conductive layer formed on a surface on the Z2 side of the piezoelectric body layer 52 and having a substantially uniform thickness (see FIG. 5). The second electrode 53 is a so-called an individual electrode formed individually for each piezoelectric actuator 38. The second electrode 53 is formed as follows, for example: a film of a conductive material such as platinum or iridium is formed by sputtering and is selectively removed by photolithography. An end portion Ec1 in the X1 direction of the second electrode 53 is formed to be positioned on the X2 side relative to the end portion Eb1 in the X1 direction of the piezoelectric body layer 52. An end portion Ec2 in the X2 direction of the second electrode 53 is formed to be positioned on the X1 side relative to the end portion Eb2 in the X2 direction of the piezoelectric body layer 52. In addition, an end portion in the Y1 direction of the second electrode 53 is formed to be positioned on the Y2 side relative to the end portion in the Y1 direction of the piezoelectric body layer 52. An end portion in the Y2 direction of the second electrode 53 is formed to be positioned on the Y1 side relative to the end portion in the Y2 direction of the piezoelectric body layer 52. In other words, the second electrode 53 is formed in such a manner that an outer shape in an XY plane view of the second electrode 53 is set inside the outer shape in an XY plane view of the piezoelectric body layer 52.

The first protection film 54 is an insulative film for covering a surface on the Z2 side of the vibration plate 36 and the plurality of piezoelectric elements Pe formed on the vibration plate 36 (see FIG. 5). A contact hole H1, which is a through-hole through which the wiring 56 and the vicinity of the end portion on the X2 side of the second electrode 53 are connected, is provided in the first protection film 54. An insulation material such as silicon oxide ($SiO_x$), silicon nitride ($SiN_x$), or the like is used for the first protection film 54. The first protection film 54, due to its insulative property, has a function to insulate the wiring 56 from the first electrode 51 and the piezoelectric body layer 52, and performs a function to suppress a situation in which the wiring 56 is electrically short-circuited with a material other than the second electrode 53.

The wiring 56 is a conductive layer formed on a surface on the Z2 side of the first protection film 54. Specifically, the wiring 56 is formed extending, on the surface on the Z2 side of the first protection film 54, in the X2 direction along a surface direction of the piezoelectric body layer 52. An end portion Ee2 on the X2 side of the wiring 56 is electrically connected to the wiring of the wiring substrate 50. Further, the wiring 56 is connected to the second electrode 53 through the contact hole H1. With this, a drive signal Vdr supplied to the wiring substrate 50 is supplied to the second electrode 53 through the wiring 56.

The second protection film 55 is a layer having moisture resistance formed on a surface on the Z2 side of the first protection film 54 and the wiring 56. The second protection film 55 includes a function to protect the piezoelectric actuator 38 from oxidation, corrosion, and the like due to oxygen, moisture, and the like contained in the atmosphere.

Figure 6:
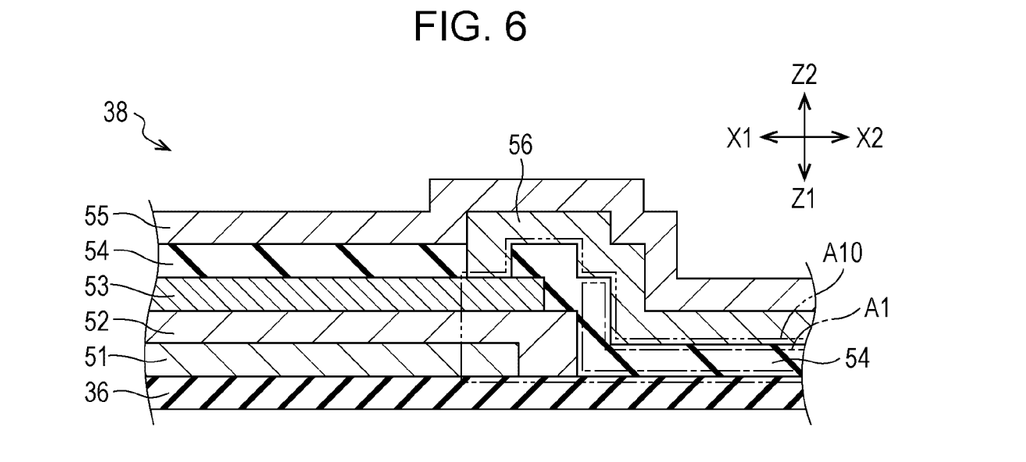
FIG. 6 is a partially enlarged cross-sectional view of the piezoelectric actuator 38.

FIG. 6 is a cross-sectional view schematically illustrating part of a structure of the piezoelectric actuator (a range Ar indicated by a dot-dash line in FIG. 5). Note that in FIG. 6, in order to facilitate the understanding of the technique, the constituent members are schematically illustrated using block shapes.

As described above, on the Z2 side of the vibration plate 36, the first electrode 51, the piezoelectric body layer 52, and the second electrode 53 of the piezoelectric element Pe are disposed in that order. In other words, the first electrode 51 is positioned between the vibration plate 36 and the piezoelectric body layer 52, and is disposed on the surface on the Z1 side of the piezoelectric body layer 52. The second electrode 53 is disposed on the surface on the Z2 side of the piezoelectric body layer 52.

In the liquid ejecting head 26 of the present embodiment, the first protection film 54 and the second protection film 55 are provided for each piezoelectric actuator 38. In FIG. 6, the first protection film 54 is so constituted as to cover the piezoelectric body layer 52 and the second electrode 53 while excluding the contact hole H1 through which the second electrode 53 communicates with the wiring 56. The second protection film 55 is formed in such a manner as to cover the wiring 56 formed on the first protection film 54.

As discussed above, the reference voltage Vbs is applied to the first electrode 51, and the drive signal Vdr is supplied to the second electrode 53 through the wiring 56. This generates a potential difference between the first electrode 51 and the second electrode 53, so that the piezoelectric body layer 52 deforms. Due to this deformation, in the piezoelectric actuator 38, a portion where the first electrode 51 is provided deforms to form a shape projected in the Z1 direction when deforming the pressure chamber Ch. The deformation of the piezoelectric actuator 38 may cause, for example, a crack to be generated in the first protection film 54. Due to the above-mentioned crack, a portion where the insulative property is lacking is generated in the first protection film 54.

In an area interposed between the Z1 side of the wiring 56 and the Z2 side of the vibration plate 36 (hereinafter, also referred to as an "area A10"), if there exists a metal layer having the same potential as the first electrode 51 by being electrically connected, there arises a problem as follows, for example.

The metal layer having the same potential as the first electrode 51 by being electrically connected, is electrically connected to the wiring 56 present on the Z2 side of the metal layer via the crack generated in the first protection film 54. In other words, there arises a trouble that the stated metal layer and the wiring 56 are electrically short-circuited. In a case where the above-mentioned trouble occurs, the piezoelectric element cannot be normally operated.

In a case where a crack is generated in the first protection film 54 and an end portion on the X2 side of the first electrode 51 is present on the X2 side relative to an end portion on the X2 side of the piezoelectric body layer 52, there is a risk of occurrence of the above trouble between the first electrode 51 and the wiring 56. Further, also in a case where a crack is generated in the first protection film 54 and the end portion on the X2 side of the first electrode 51 is present on the X2 side relative to an end portion on the X2 side of the second electrode 53, there is a risk that the above-mentioned trouble occurs between the first electrode 51 and the wiring 56.

As discussed above, within the area A10 interposed between the surface on the Z1 side of the wiring 56 and the surface on the Z2 side of the vibration plate 36, in a case where a metal layer having the same potential as the first electrode 51 is disposed in an area where the wiring 56 overlaps with none of the second electrode 53 and the piezoelectric body layer 52 in an XY plane view (hereinafter, also referred to as a "first area A1"), there arises a risk that a trouble occurs in which the first electrode 51 and the wiring 56 are electrically short-circuited.

A metal layer is not provided in the first area A1 in the present embodiment. Therefore, even when the drive signal Vdr is supplied and a current is supplied to the wiring 56, a trouble that the wiring 56 is electrically short-circuited between the first area A1 and the wiring 56 will not occur. In addition, since the trouble of short circuiting does not occur, it is unnecessary to provide an insulative function in the first protection film 54 formed between the wiring 56 and the vibration plate 36. Accordingly, a range capable of selecting a material for the first protection film 54 can be expanded to a range of materials not including the insulative function.

Second Embodiment

Figure 7:
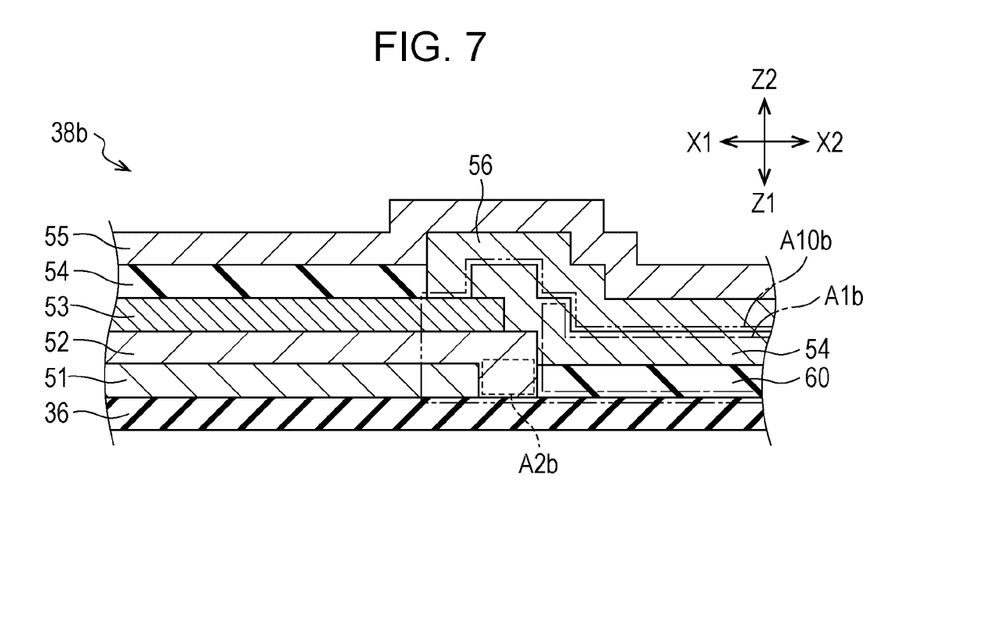
FIG. 7 is a partially enlarged cross-sectional view of a piezoelectric actuator 38b according to a second embodiment.

FIG. 7 is a cross-sectional view illustrating a structure of a piezoelectric actuator 38b according to a second embodiment. An area interposed between a surface on the Z1 side of the wiring 56 and a surface on the Z2 side of the vibration plate 36 is taken as an area A10b. In addition, of the area A10b, an area in which the wiring 56 overlaps with none of the second electrode 53 and the piezoelectric body layer 52 in an XY plane view is taken as a first area A1b. The piezoelectric actuator 38b according to the second embodiment includes a metal layer 60 in the first area A1b. Other points of the second embodiment are the same as those of the first embodiment. Note that in FIG. 7, in order to facilitate the understanding of the technique, the constituent members are schematically illustrated using block shapes.

The metal layer 60 is a layer that is constituted with the same metal material as that of the first electrode 51, and has a substantially uniform thickness. Between an end portion on the X2 side of the first electrode 51 and an end portion on the X1 side of the metal layer 60, there exists the piezoelectric body layer 52 formed in such a manner as to cover the outer shape of the first electrode 51. In other words, the metal layer 60 is so formed as not to make contact with the first electrode 51 due to the piezoelectric body layer 52 as an insulation body, thereby being formed not to be electrically connected to the first electrode 51. Even in the above-described mode, since the metal layer 60 and the first electrode 51 are not electrically connected, a trouble that the wiring 56 is electrically short-circuited will not occur when the drive signal Vdr is supplied to the wiring 56.

In addition, the first electrode 51 and the metal layer 60 to be insulated from the first electrode 51 can be formed as follows: a metal layer to be the material of the first electrode 51 is formed being extended to an area including the metal layer 60, and thereafter a predetermined area is selectively removed by etching, for example. The predetermined area refers to, in the drawing, an area from the end portion in the X2 direction of the first electrode 51 to the end portion in the X1 direction of the metal layer 60 (hereinafter, also referred to as an "area A2b"), for example. Note that the area A2b is formed along the Y direction (a direction parallel to a depth direction in FIG. 7). The metal layer 60 does not make contact with any portion of the first electrode 51 in the Y direction, and is formed having the same constitution as above in each of the piezoelectric actuators 38b arranged in the Y direction. As a material of the first protection film 54, an existing material taking into consideration adhesiveness with the first electrode 51 can be employed.

Third Embodiment

Figure 8:
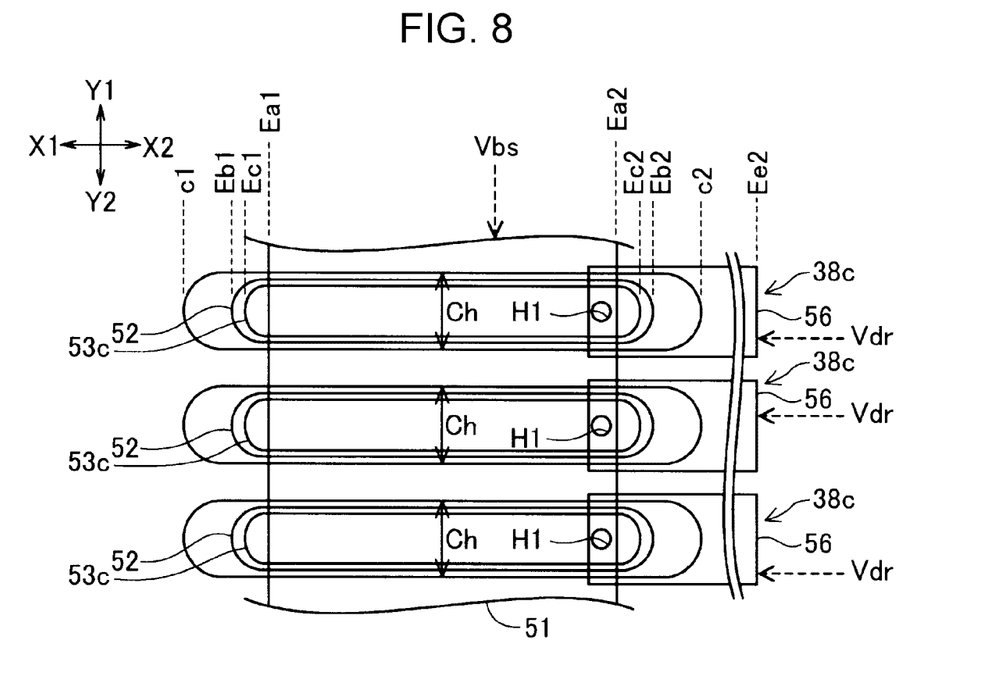
FIG. 8 is a plan view illustrating arrangement of a pressure chamber, a piezoelectric actuator 38c, and wiring when a liquid ejecting head is seen through in the Z direction.

FIG. 8 is a plan view illustrating arrangement of the pressure chamber Ch, a piezoelectric actuator 38c according to a third embodiment, and the wiring 56 when the liquid ejecting head 26 is seen through in the Z direction. Members that cannot be visually recognized due to members positioned on a front side of FIG. 8 (in the Z2 direction) are also illustrated in FIG. 8. The piezoelectric actuator 38c of the third embodiment includes a second electrode 53c further extended along the X direction than the second electrode 53 of the first embodiment. Other constituent elements of the piezoelectric actuator 38c of the third embodiment are the same as those of the piezoelectric actuator 38 of the first embodiment.

Figure 9:
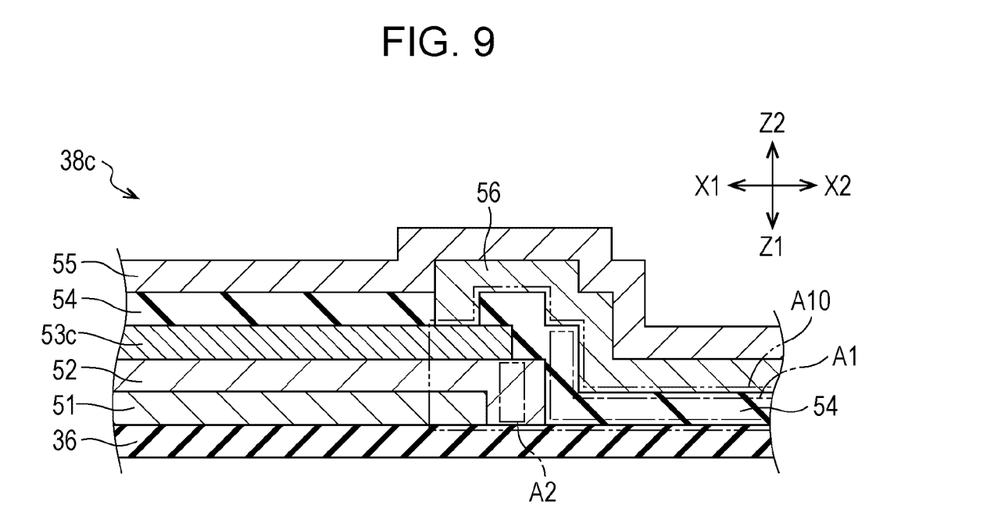
FIG. 9 is a cross-sectional view schematically illustrating a structure of the piezoelectric actuator 38c within a range Ar.

FIG. 9 is a cross-sectional view schematically illustrating a structure of the piezoelectric actuator 38c within the range Ar. Note that in FIG. 9, in order to facilitate the understanding of the technique, the constituent members are schematically illustrated using block shapes. A second area A2, which will be explained later, is schematically exemplified and illustrated in FIG. 9.

The second area A2 is an area between the second electrode 53c and the vibration plate 36, and between the vibration plate 36 and an end portion of the second electrode 53c on the side of a direction in which the wiring 56 extends (the X2 direction side in FIG. 9). The second area A2 of the piezoelectric actuator 38c is constituted with an insulation portion made of an insulation material including the piezoelectric body layer 52. This insulation portion is constituted only by the piezoelectric body layer 52 in the present embodiment. In other words, the piezoelectric body layer 52 is constituted in such a manner as to cover the end portion on the X2 direction side of the first electrode 51 in the second area A2.

In this specification, the "end portion on the X2 direction side of the second electrode 53c" refers to an arc-shaped portion, which is the end portion on the X2 direction side of the second electrode 53c (see FIG. 8), and is formed in the same constitution as above in each of the piezoelectric actuators 38c arranged in the Y direction. Further, the "area between the end portion of the second electrode 53c and the vibration plate 36" refers to an area that includes a line connecting the vibration plate 36 and an end portion of a surface of the second electrode 53c on a side where the piezoelectric body layer 52 is provided, and has a predetermined width.

This makes it possible to suppress an electrical connection of the first electrode 51 with the wiring 56 due to the piezoelectric body layer 52 as the insulation portion. Accordingly, even in the above-discussed mode, a trouble that the first electrode 51 and the wiring 56 are short-circuited can be prevented at a time when a voltage is applied to the second electrode 53c through the wiring 56.

Fourth Embodiment

Figure 10:
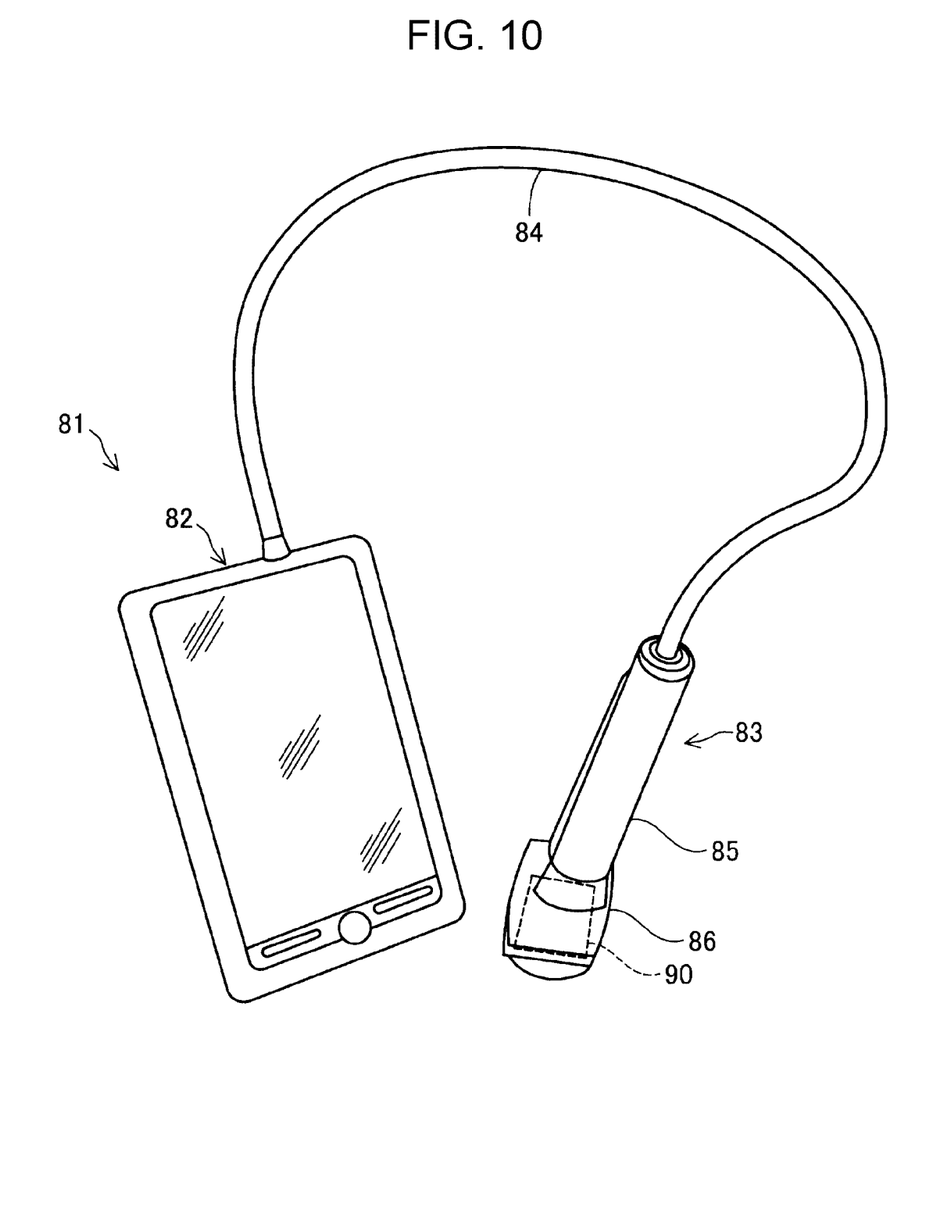
FIG. 10 is a diagram illustrating a configuration of an ultrasonic diagnostic apparatus equipped with an ultrasonic sensor.

FIG. 10 is a diagram illustrating a configuration of an ultrasonic diagnostic apparatus 81 equipped with an ultrasonic sensor 90, which is a type of piezoelectric device, according to a fourth embodiment. In each of the above embodiments, although the constitution in which ink as a type of liquid is ejected through the nozzle Nz by the pressure chamber Ch being deformed is exemplified and described, the embodiment of the invention is not limited thereto. The invention can also be applied to a sensor configured to detect vibrations (displacement) or the like of a measurement target, like the ultrasonic sensor 90 according to the present embodiment. Because of this, the pressure chamber Ch in the present disclosure is not limited to a pressure chamber through which a liquid flows.

The ultrasonic diagnostic apparatus 81 illustrated in FIG. 10 includes a device terminal 82 and an ultrasonic probe 83. The device terminal 82 and the ultrasonic probe 83 are connected to each other with a cable 84. The device terminal 82 and the ultrasonic probe 83 transmit/receive electric signals through the cable 84. The ultrasonic probe 83 includes a main body section 85, and a probe head 86 detachably attached to the main body section 85. The ultrasonic sensor 90 is provided in the probe head 86. The ultrasonic sensor 90 detects a distance to the measurement target, a shape of the measurement target, or the like by transmitting sonic waves or ultrasonic waves from its surface (a surface illustrated in FIG. 11) toward the measurement target and receiving reflected waves from the measurement target.

Figure 11:
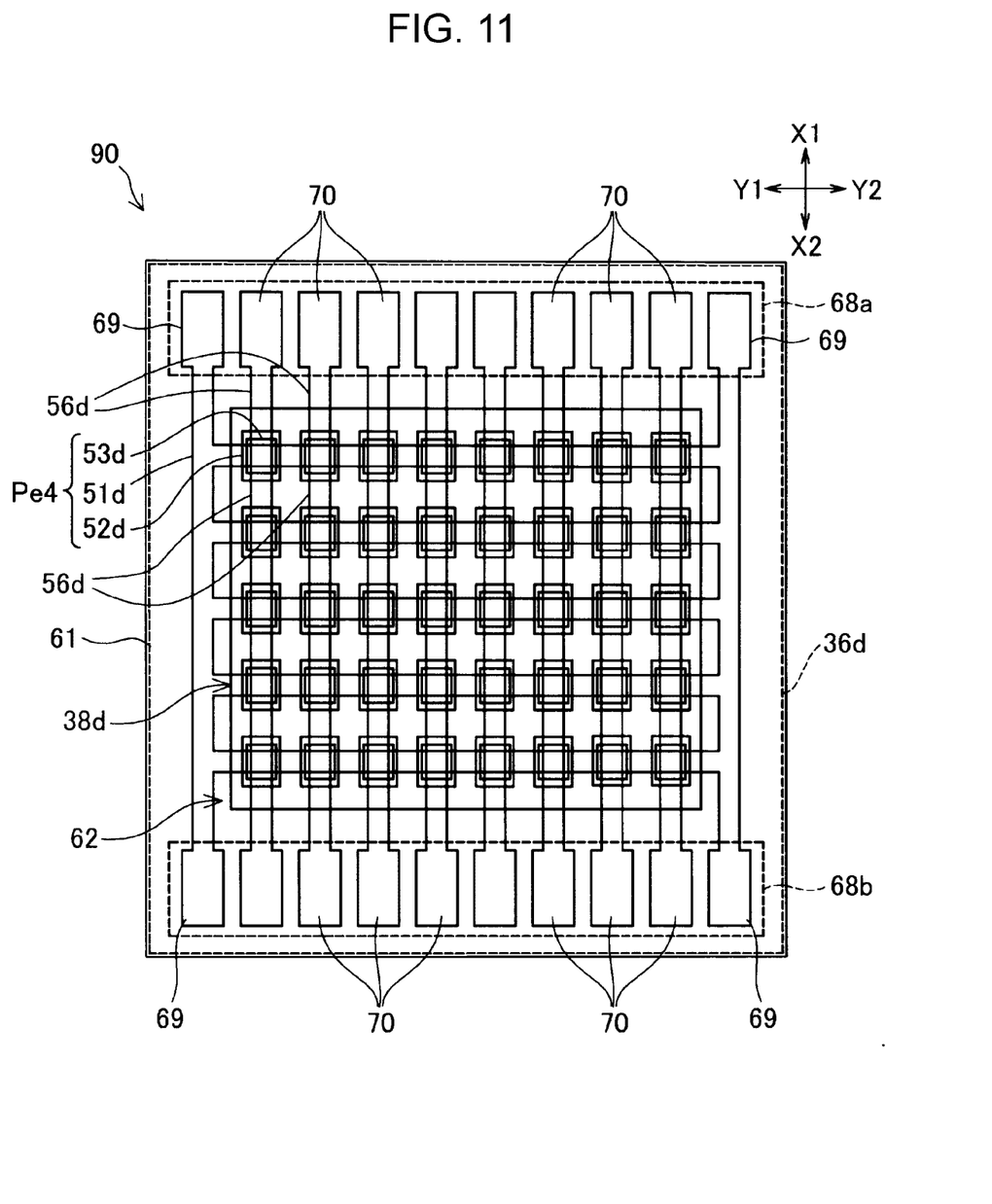
FIG. 11 is a plan view illustrating an example of the ultrasonic sensor.

FIG. 11 is a plan view illustrating an example of the ultrasonic sensor 90 according to the present embodiment. The ultrasonic sensor 90 of the present embodiment is constituted in such a manner that an element array 62 is formed on a base substrate 61. The element array 62 is configured by the arrangement of piezoelectric elements Pe4. The arrangement is formed in a matrix of multiple rows by multiple columns. The piezoelectric element Pe4 is constituted of a first electrode 51d as a lower electrode, a second electrode 53d as an upper electrode, and a piezoelectric body layer 52d, where the piezoelectric body layer 52d is interposed between the second electrode 53d and the first electrode 51d. The respective piezoelectric elements Pe4 are disposed on a single-layered vibration plate 36d. In the present embodiment, the vibration plate 36d, a pressure chamber Ch (not illustrated in FIG. 11) of each piezoelectric actuator 38d, and a reinforcement plate (not illustrated) are provided in that order toward the Z1 direction side (toward the depth direction side in FIG. 11) relative to the first electrode 51d.

In the present embodiment, the first electrode 51d functions as a common electrode common to the respective piezoelectric elements Pe4, while the second electrode 53d functions as an individual electrode of each piezoelectric element Pe4. The functions of the second electrode 53d and the first electrode 51d may be replaced with each other. In other words, the upper electrode may be so provided as to be common to the piezoelectric elements Pe4 of the whole matrix, while the lower electrodes may be individually provided to the respective piezoelectric elements Pe4. In addition, the arrangement of the element array 62 can also employ a configuration in which positions in a column direction of the piezoelectric elements Pe4 of adjacent columns differ alternately, for example. In this case, the configuration may be such that a group of piezoelectric elements Pe4 on an even column are disposed being shifted in the column direction by half a row pitch with respect to a group of piezoelectric elements Pe4 on an odd column.

On the base substrate 61, a first terminal array 68a and a second terminal array 68b are respectively formed at the locations distanced from the element array 62, one of which is one end side and the other of which is another end side in the column direction (X direction) of the piezoelectric elements Pe4. Each of the terminal arrays 68a and 68b is constituted of a pair of common electrode terminals 69 disposed on both sides in a row direction (Y direction) and a plurality of individual electrode terminals 70 disposed between the common electrode terminals 69 on both the sides. The common electrode terminal 69 is conducted to the second electrode 53d of the piezoelectric element Pe4, and the individual electrode terminal 70 is conducted to the first electrode 51d of the piezoelectric element Pe4. A flexible wiring substrate (not illustrated) with one end thereof connected to a control circuit (not illustrated) of the ultrasonic diagnostic apparatus 81, is electrically connected to the terminal arrays 68a and 68b. A drive signal Vdr and a reception signal Vr, which will be explained later, are transmitted/received between the control circuit and the ultrasonic sensor 90 via the flexible wiring substrate. A reinforcement plate (not illustrated) is bonded, with an adhesive agent, to a surface on the Z1 direction side of the base substrate 61 (hereinafter, also called a "rear surface"), whereby the pressure chamber Ch of each piezoelectric element Pe4 is closed. A silicon substrate, for example, can be used for the reinforcement plate.

In the ultrasonic sensor 90, in a transmission period (vibration period) during which ultrasonic waves are transmitted, the control circuit outputs the ultrasonic waves, and the ultrasonic waves are supplied (applied) to the first electrode 51d of each of the piezoelectric elements Pe4 through the individual electrode 70. In a reception period (vibration period) during which the reflected waves (echoes) of the ultrasonic waves are received, the reception signal Vr from the piezoelectric element Pe4 is outputted through the first electrode 51d and the individual electrode terminal 70. In addition, a common voltage VCOM is supplied to the second electrode 53d of each piezoelectric element Pe4 via the common electrode terminal 69. The common voltage VCOM is a constant DC voltage. When a voltage of a difference between the drive signal Vdr and the common voltage VCOM is applied to each of the piezoelectric elements Pe4, ultrasonic waves of a predetermined frequency are transmitted from each of the piezoelectric elements Pe4. Subsequently, ultrasonic waves radiated from each of the piezoelectric elements Pe4 are combined, and ultrasonic waves radiated from an element array surface of the ultrasonic sensor 90 are formed. The stated ultrasonic waves are transmitted toward a measurement target (for example, the inside of a human body). After the transmission of the ultrasonic waves, the reflected waves, reflected from the measurement target, are inputted to the piezoelectric element Pe4, the stated piezoelectric element Pe4 vibrates as a vibration detection unit in response to the input of the reflected wave, thereby generating electromotive force. This electromotive force is outputted as the reception signal Vr to the control circuit. In the present embodiment, a group of piezoelectric elements functioning as vibration detection units alternately perform the transmission of sonic waves and the reception of reflected waves at different timing.

The second electrode 53d is connected to wiring 56d extended from the individual electrode terminal 70. That is, in the present embodiment, both an end portion on the X1 side and an end portion on the X2 side of the second electrode 53d of each piezoelectric actuator 38d are connected by the wiring 56d. In the present embodiment, second areas A2 are the following two areas: an area between the vibration plate 36 and the end portion on the X1 direction side of the second electrode 53d, the X1 direction side being the side of a direction in which the wiring 56 extends; and an area between the vibration plate 36 and the end portion on the X2 direction side of the second electrode 53d. Each of the piezoelectric actuators 38d includes the piezoelectric body layer 52d as an insulation portion in these two second areas A2. In other words, the piezoelectric body layer 52d is constituted in such a manner as to cover, in the second areas, the end portion on the X1 direction side of the first electrode 51d and the end portion on the X2 direction side of the first electrode 51d. Accordingly, even in the above-discussed mode, a trouble that the first electrode 51 and the wiring 56 are short-circuited can be prevented at a time when a voltage is applied to the second electrode 53c through the wiring 56.

OTHER EMBODIMENTS

Another Embodiment 1

1. In the above embodiments, a mode in which a metal layer is not provided in the first area A1, or a mode in which the metal layer 60 made of the same material as that of the first electrode 51 and not electrically connected to the above first electrode is provided in the first area A1b is described. In other words, such a mode can be achieved in which the first area does not include a metal layer whose potential is controlled to be a different potential from a potential of the second electrode. With the above mode, such a trouble can be prevented that the second electrode is electrically short-circuited with another circuit through an electrode layer having a different potential from the potential of the second electrode. For example, such a mode can be achieved that a metal layer having the same potential as the first electrode due to being connected to the first electrode is not provided. With the above configuration, a trouble that the wiring 56 is electrically short-circuited with the first electrode will not occur, even when a current is supplied to the wiring 56.

2. In the above embodiments, the piezoelectric actuator 38 is configured such that it deforms to form a shape projected toward the pressure chamber Ch side when a voltage is applied thereto, and becomes flat like a plate when the voltage is not applied. However, such a mode can be achieved that the piezoelectric actuator is formed to have a plate-like shape when the voltage is applied thereto, and formed to have another shape when the voltage is not applied. In other words, it is sufficient for the piezoelectric actuator to be capable of deforming depending on presence/absence of voltage application. In addition, it does not matter whether the deformation of the piezoelectric actuator is bending deformation or strain deformation.

3. In the above embodiments, the piezoelectric body layer 52 is so formed as to cover the outer shape of the first electrode 51. However, such a mode can also be achieved that the piezoelectric body layer is so formed as not to cover the outer shape of the first electrode 51, in a case where, for example, the respective end portions on the X2 side of the first electrode 51, the piezoelectric body layer 52, and the second electrode 53 are formed to be substantially at the same positions, or the like. In this case, it is preferable that the first protection film be formed in such a manner as to protect the first electrode 51, the piezoelectric body layer 52, and the second electrode 53.

4. In the above embodiments, such a mode can also be achieved that a length of the width of the wiring 56 in a direction substantially perpendicular to the direction in which the wiring 56 extends (the Y direction in FIGS. 4 and 8) is shorter than a length of the width in the Y direction of the piezoelectric body layer 52. In this mode, it is possible to further suppress the occurrence of a trouble that the first electrode 51 and the wiring 56 are short-circuited.

Another Embodiment 2

1. In the second embodiment, between an end portion on the X2 side of the first electrode 51 and an end portion on the X1 side of the metal layer 60, there exists the piezoelectric body layer 52 formed in such a manner as to cover the outer shape of the first electrode 51. However, the piezoelectric body layer 52 does not exist on a surface on the Z2 side of the metal layer 60. However, such a mode can be achieved that the piezoelectric body layer exists on the surface on the Z2 side of the metal layer 60. For example, after the formation of the first electrode 51 and the metal layer 60, the piezoelectric body layer can be formed on the surface on the Z2 side of the first electrode 51 and the surface on the Z2 side of the metal layer 60 at the same time.

2. In the second embodiment, the metal layer 60 is constituted with the same metal material as that of the first electrode 51. However, the metal layer may be constituted with a metal material different from that of the first electrode 51. Note that the techniques disclosed in the present specification are particularly effective in a case where the material constituting the first electrode and the material constituting the metal layer are the same.

Another Embodiment 3

1. In the above embodiments, the liquid ejecting head 26 and the liquid container 14 are connected to each other by a predetermined ink channel, and the liquid container 14 is not transported by the movement mechanism 24. However, such a mode can be achieved that the liquid ejecting head and the liquid container are integrally formed and moved by the movement mechanism. The techniques disclosed in the present specification can also be applied to a liquid ejecting head unit in which the above-mentioned liquid ejecting head and the liquid container are fixed to each other.

2. In the above embodiments, the insulation portion of the second area A2 is constituted only by the piezoelectric body layer 52. However, the second area is not limited to the constitution including only the piezoelectric body layer. For example, the insulation portion may include the piezoelectric body layer, and may further include an insulative film such as the first protection film, another insulation material, or the like.

Another Embodiment 4

In the above embodiments, the techniques disclosed in the present specification are described while exemplifying the liquid ejecting head 26 and the liquid ejecting apparatus 100. However, the techniques disclosed in the present specification are not limited to the liquid ejecting head and the liquid ejecting apparatus, and can be applied to various types of piezoelectric devices in which wiring on one surface of a flat plate where electrodes are disposed is connected to piezoelectric elements constituted in a flat plate form.

For example, the techniques disclosed in the present specification can be applied to an ultrasonic vibrator configured to generate ultrasonic waves by vibrating piezoelectric elements. Further, the techniques disclosed in the present specification can be applied to a liquid feeding pump configured to feed a liquid by operating piezoelectric elements. The techniques disclosed in the present specification can be applied to an MEMS motor configured to rotate the rotor by the vibrations of piezoelectric elements. Furthermore, the techniques disclosed in the present specification can be applied to an atmospheric pressure sensor configured to transmit a signal by piezoelectric elements being deformed in accordance with environmental pressure.

Others

The present disclosure is not limited to the aforementioned embodiments, and can be implemented in various configurations within a range not departing from the scope and spirit of the disclosure. For example, the technical features in the embodiments corresponding to the technical features in the aspects described in the section of summary of the invention can be appropriately exchanged, combined, or the like with each other in order to solve part of or all of the above-mentioned problems or to obtain part of or all of the above-mentioned effects. In addition, the above technical features can be appropriately removed unless the stated features are described to be absolutely necessary in the present specification.

What is claimed is:

1. A liquid ejecting head comprising:
a pressure chamber to accommodate a liquid;
a vibration plate constituting a wall surface of the pressure chamber;
a nozzle to eject the liquid accommodated in the pressure chamber; and
a piezoelectric element disposed on one side of the vibration plate,
wherein the piezoelectric element includes,
a piezoelectric body layer configured to deform when a voltage is applied to the piezoelectric body layer,
a first electrode positioned between the vibration plate and the piezoelectric body layer and disposed on one surface of the piezoelectric body layer, and
a second electrode disposed on the other surface of the piezoelectric body layer, and
the liquid ejecting head further includes wiring connected to the second electrode and extended along a surface direction of the piezoelectric body layer,
wherein a metal layer positioned in a first area, which is an area positioned between the wiring and the vibration plate and in which the wiring overlaps with none of the second electrode and the piezoelectric body layer in a direction perpendicular to a surface direction of the second electrode, does not have the same potential as the first electrode and does not electrically connect to the first electrode.

2. The liquid ejecting head according to claim 1,
wherein the metal layer positioned in the first area is made of the same material as a material of the first electrode.

3. A liquid ejecting apparatus comprising the liquid ejecting head according to claim 1.

4. A liquid ejecting apparatus comprising the liquid ejecting head according to claim 2.

5. A piezoelectric device comprising:
a vibration plate; and
a piezoelectric element disposed on one side of the vibration plate,
wherein the piezoelectric element includes,
a piezoelectric body layer configured to deform when a voltage is applied to the piezoelectric body,
a first electrode positioned between the vibration plate and the piezoelectric body layer and disposed on one surface of the piezoelectric body layer, and
a second electrode disposed on the other surface of the piezoelectric body layer, and
the piezoelectric device further includes wiring connected to the second electrode and extended along a surface direction of the piezoelectric body layer,
wherein a metal layer positioned in a first area, which is an area positioned between the wiring and the vibration plate and in which the wiring overlaps with none of the second electrode and the piezoelectric body layer in a direction perpendicular to a surface direction of the second electrode, does not have the same potential as the first electrode and does not electrically connect to the first electrode.

6. The liquid ejecting head according to claim 1,
wherein the piezoelectric element further includes
a second area, which is an area positioned between the second electrode and the vibration plate and is also positioned between the vibration plate and an end portion of the second electrode on a side of a direction in which the wiring is extended, which is constituted of an insulation portion including the piezoelectric body layer.

7. The piezoelectric device according to claim 5,
wherein the piezoelectric element further includes
a second area, which is an area positioned between the second electrode and the vibration plate and is also positioned between the vibration plate and an end portion of the second electrode on a side of a direction in which the wiring is extended, which is constituted of an insulation portion including the piezoelectric body layer.

8. A liquid ejecting head comprising:
a pressure chamber to accommodate a liquid;
a vibration plate constituting a wall surface of the pressure chamber;
a nozzle to eject the liquid accommodated in the pressure chamber; and
a piezoelectric element disposed on one side of the vibration plate,
wherein the piezoelectric element includes,
a piezoelectric body layer configured to deform when a voltage is applied to the piezoelectric body layer,
a first electrode positioned between the vibration plate and the piezoelectric body layer and disposed on one surface of the piezoelectric body layer, and
a second electrode disposed on the other surface of the piezoelectric body layer, and
the liquid ejecting head further includes a wiring connected to the second electrode and extended along a surface direction of the piezoelectric body layer,
wherein a metal layer positioned in a first area, which is an area positioned between the wiring and the vibration plate and in which the wiring overlaps with none of the second electrode and the piezoelectric body layer in a direction perpendicular to a surface direction of the second electrode, does not have the same potential as the first electrode, does not electrically connect to the first electrode, and is made of the same material as a material of the first electrode in the first area.

\* \* \* \* \*